United States Patent [19]

Miyazaki et al.

[11] Patent Number: 5,350,886
[45] Date of Patent: Sep. 27, 1994

[54] MOUNTING SUBSTRATE

[75] Inventors: Kunio Miyazaki, Hitachi; Yutaka Sugita, Tokorozawa; Akio Mukoh, Mito; Tadahiko Miyoshi; Osamu Miura, both of Hitachi; Akio Takahashi, Hitachiota; Shunichi Numata, Hitachi; Satoru Ogihara, Hitachi; Kazuji Yamada, Hitachi; Hirokazu Inoue, Ibaraki; Fumiyuki Kobayashi, Sagamihara, all of Japan

[73] Assignee: Hitachi, Ltd., Tokyo, Japan

[21] Appl. No.: 659,672

[22] Filed: Feb. 25, 1991

[30] Foreign Application Priority Data

Feb. 26, 1990 [JP] Japan .................................. 2-042468

[51] Int. Cl.$^5$ .............................................. H05K 1/00
[52] U.S. Cl. ..................................... 174/250; 174/255; 174/264; 361/784
[58] Field of Search ................ 174/250, 255, 259, 264; 361/400, 412, 414, 416, 784

[56] References Cited

U.S. PATENT DOCUMENTS

| | | | |
|---|---|---|---|
| 4,202,007 | 5/1980 | Dougherty et al. | 361/414 X |
| 4,368,503 | 1/1983 | Kurosawa et al. | 361/414 |
| 4,628,407 | 12/1986 | August et al. | 361/414 X |
| 4,685,033 | 8/1987 | Inoue | 361/414 |
| 4,692,843 | 9/1987 | Matsumoto et al. | 361/414 |
| 4,803,595 | 2/1989 | Kraus et al. | 361/412 |
| 4,899,439 | 2/1990 | Potter et al. | 361/414 X |
| 5,072,075 | 12/1991 | Lee et al. | 361/414 X |
| 5,081,563 | 1/1992 | Feng et al. | 174/260 X |
| 5,089,880 | 2/1992 | Meyer et al. | 361/414 X |

Primary Examiner—Leo P. Picard
Assistant Examiner—Cheryl R. Figlin
Attorney, Agent, or Firm—Antonelli, Terry, Stout & Kraus

[57] ABSTRACT

An LSI mounting substrate having a multilayered thin film wiring portion, with the thin film wiring portion being divided into wiring units each composed of a plurality of wiring layers, with the wirings between the units being electrically connected through connecting pads defined in the same surface as that of a surface conductive layer of the unit.

23 Claims, 3 Drawing Sheets

MOUNTING SUBSTRATE

BACKGROUND OF THE INVENTION

The present invention relates to a mounting substrate on which a plurality of LSIs are mounted in an electronic computer, and more particularly, to a mounting substrate having a multi-layered wiring structure formed by a thin film process with insulating layers of an organic film composed of polyimide or the like.

In a mounting substrate used in an electronic computer, a problem arises when attempting to enhance the mounting density of many LSIs to thereby minimize a signal delay in the substrate, and to increase a speed of signals transmitted between the LSIs.

To cope with this problem, attention is paid to a mixed substrate composed of a thin film and thick film, which comprises a ceramic substrate on which a wiring layer of tungsten or molybdenum formed by a thick film process is laminated and sintered, a polyimide interlayer insulating film formed thereon, and a conductive layer of copper or aluminium formed thereon by a thin film process, and this mixed substrate is in a process of development. With this arrangement, a signal can be transmitted at a high speed in high density, because a dielectric constant of polyimide in a thin film wiring portion is smaller than that of ceramics, copper and aluminium of low resistance and a semiconductor process can be used.

However, the number of laminated layers of a thin film wiring layer must be increased to cope with an increase in the number of mounted gates per unit area, which is needed by the improvement in performance of computers.

Several technologies for forming thin film multi-layered wirings have been reported. They employ, however, a thin film process as the basic process thereof, in which conductive layers, through holes and polyimide layers are patterned on a ceramic substrate or silicon substrate by exposing and developing photoresist. This thin film process is suitable to miniaturize wirings, but has a drawback in that since this process is a so-called sequential laminating system by which conductors and through holes are individually made a long time is needed to form a thin film wiring composed of many laminated layers, and further an entire substrate becomes defective if the substrate is determined to be defective in the final process and thus yield is lowered and a cost of products is increased. Further, a resistance of wirings is suppressed to a low level in the thin film wiring, and thus when a width of the wirings is miniaturized, a thickness thereof must be increased to provide a given cross sectional area.

As a result, a thickness of a wiring layer is made to be the same or greater than a width of wirings, and thus a problem arises in that even if fluid polyimide varnish is used, flatness is difficult to obtain, an accuracy of a wiring pattern is deteriorated as the number of laminated layers is increased, so that the wirings are often cut off or short-circuited. Further, a problem also arises in that, since a ceramic substrate having I/O terminals and the thin film wiring portion of an underlayer are repeatedly heated and immersed in water, chemicals and the like, they are deteriorated at the boundary thereof and polluted by the ions in impurities, whereby the reliability thereof is lowered.

To solve these problems, for example, in Japanese Patent Application Kokai 61-40048, there is disclosed a package comprising an original ceramic substrate having I/O terminals and a separate substrate which has a thin film wiring formed thereon and connected on the original substrate by soldering. This package, which has the thin film wiring portion simply formed independently of the ceramic substrate, is fundamentally different from that of the present invention, in which a thin film portion is formed as a unit. Further, in this prior art, since a tentative substrate used to form a thin film serves as an element for forming the package as it is, a thin film wiring layer has a thickness which is unnecessarily increased and thus this is not preferable in view of the increase of a transmitting speed of a signal.

Further, Japanese Patent Application Kokai No. 63-274199 discloses another method by which polyimide films in which wirings are formed are laminated in one lot and through hole portions are thermally bonded under pressure.

This method is effective to reduce a throughput time, but a problem arises in that, since a polyimide thin film is treated in a laminating process, an aligning accuracy is difficult to improve, the number of contact points is greatly increased, and a connecting portion has low reliability.

SUMMARY OF THE INVENTION

An object of the present invention is to eliminate the above defects and to provide a hybrid substrate arranged so as to enable a thin film wiring layer to be formed in a short time with improved yield even if a substrate has many thin film wiring layers.

Another object of the present invention is to provide a method of manufacturing the above hybrid substrate.

The objects of the present invention will be achieved in such a manner that a thin film wiring layer having many laminated layers is first divided into unit wiring portions each composed of some layers, the unit wiring portions are connected with each other through connecting pads defined to through hole portions therebetween, and further a wiring unit is formed on tentative substrate. More specifically, after the through hole portions have been confronted with each other and the units have been electrically connected, a unit substrate is separated from the tentative substrate and this separating operation is repeatedly carried out, whereby thin film layers can be formed with improved yield in a short time.

DETAILED DESCRIPTION OF THE INVENTION

Figure 1:
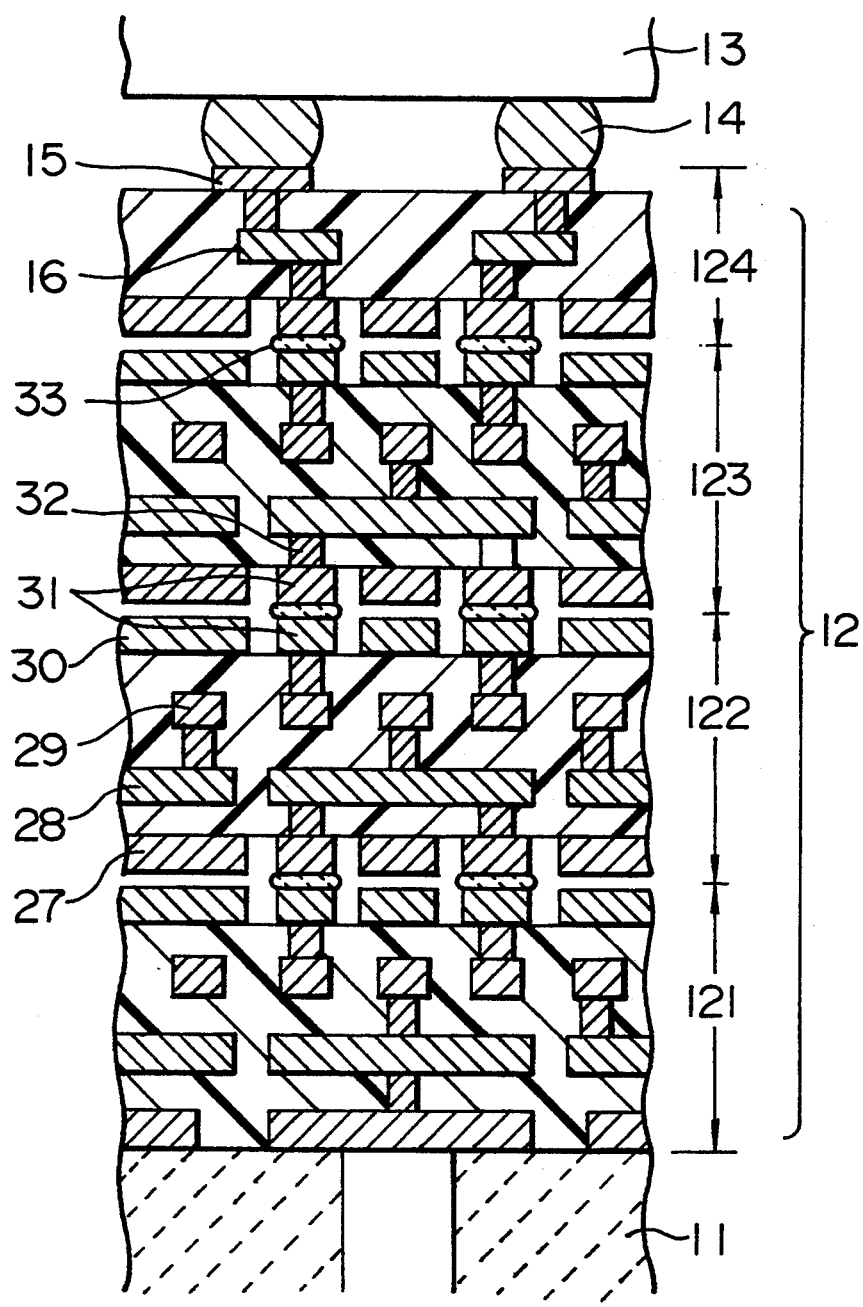
FIG. 1 is a cross sectional view of a mounting substrate according to the present invention.
Figure 2A:
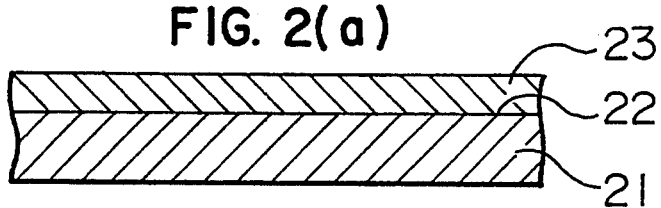
FIGS. 2(a) to 2(e) show the various processing steps of a method of manufacturing a wiring unit composed of four layers using copper and polyimide.
Figure 2B:
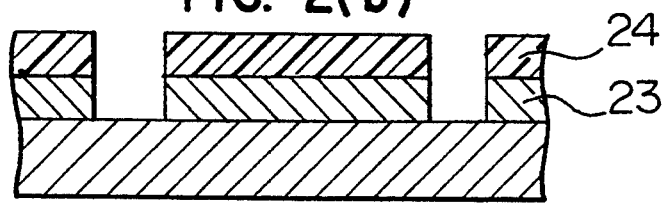
Figure 2C:
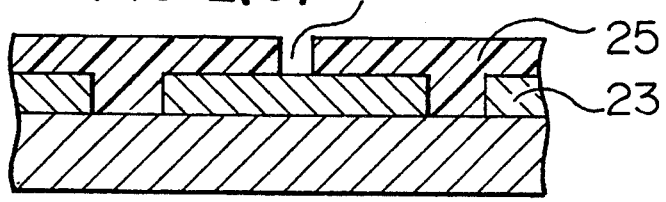
Figure 2D:
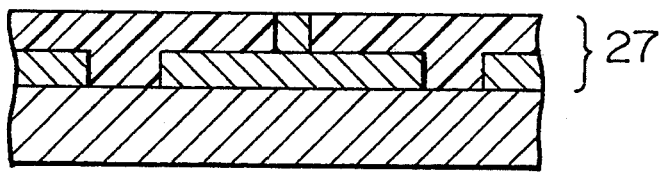
Figure 2E:
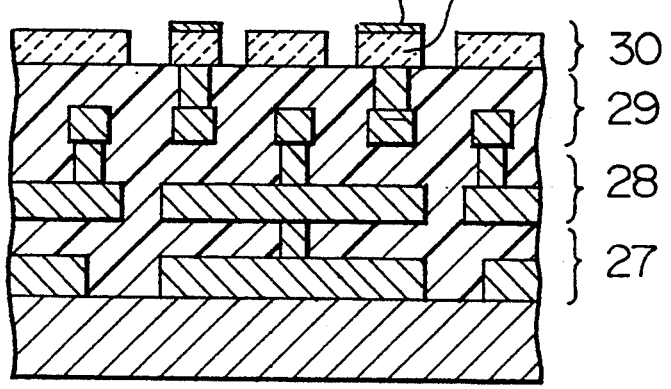

A mounting substrate according to the present invention is an LSI mounting substrate having a multilayered thin film wiring portion on a ceramic or silicon substrate, wherein the thin film wiring portion is divided into wiring units each composed of a plurality of wiring layers and wirings between the units are electrically connected through connecting pads defined in the same surface as that of the surface conductive layer of the unit.

Further, a portion of the wiring unit is composed of a signal layer, a power supply layer, and a ground layer, the power supply layer and the ground layer are formed on both surfaces, and the respective layers are electrically connected via through holes.

Further, the power supply layer and the ground layer of the wiring unit are an overall film and pads electrically insulated from the overall film is formed in the overall film.

The conductive layer of the wiring layer constituting the wiring unit is preferably composed of any one metal of Cu, Al, Au, and Ag.

The insulating layer of the wiring layer constituting the wiring unit is preferably composed of polyimide.

Further, the surfaces of two units disposed in confrontation (e.g., in a vertically stacking arrangement) for connection preferably have the same conductive pattern configuration.

Further, the connecting pads between the wiring units preferably have a size (e.g., a plan view area) larger than that of through holes for connecting the wirings of respective inner layers.

On the other hand, the unit is preferably formed using a tentative substrate comprising a material different from that constituting the thin film wiring portion.

Further, the unit is preferably formed on the tentative substrate by a thin film process.

The reason why the thin film wiring is divided into units each having a plurality of wiring layers and the units are connected through connecting pads is that each thin film wiring layer can be made as a divided unit, so that final yield can be greatly improved by selecting good products and bad products before the units are connected. Further, a time needed to make the mounting substrate can be greatly reduced by making the respective units in parallel.

The reason why the signal layer is formed as an inner layer and the power supply layer and ground layer are formed as an outer layer in the arrangement of the wiring unit is that because the power supply layer and ground layer are fundamentally an overall film, this arrangement can protect signal wiring layers each having a fine wiring width and through holes, and connecting pads having a size larger than that of fine through holes for connecting wiring layers between the units can be formed in the power supply layer and ground layer to thereby increase the reliability of the connection between the units.

Further, the reason why the tentative substrate is used to form the above wiring units is that the wiring units can be formed by a sequential process, a wiring width and wiring pitch can be easily miniaturized because the layers are sequentially laminated, two units can be more accurately aligned when they are connected, and the tentative substrate can be used as a pressurizing jig when the units are connected.

Further, the reason why the above tentative substrate is composed of a specific material and subjected to a surface treatment whereby the substrate can be easily separated from the unit after connecting the units with each other is to enable the tentative substrate to be separated from the units without injuring the connected portion of the units.

DESCRIPTION OF PREFERRED EMBODIMENTS

The present invention will be described below with reference to drawings.

FIG. 1 shows a cross sectional view of a mounting substrate according to the present invention. A highly integrated LSI 13 is connected to a thin film wiring layer 12, formed on a ceramic substrate 11 by solder balls 14. The above thin film layer is divided into four units 121, 122, 123, and 124. Each of the units except the uppermost unit (124) is composed of two signal line layers 28, 29 perpendicular to each other and a power supply layer and ground layer 27, 30 disposed on the both sides thereof. The uppermost layer unit 124 is composed of pads 15 used for connecting the uppermost layer unit to the LSI and enlarged layers 16 for adjusting a pitch of the pads and a pitch of through holes in the underlayer unit, but sometimes a final resistance layer and power supply layer may be added in the uppermost layer.

The above respective units are connected by confronting connecting pads 31 formed in the power supply layer and ground layer on the surface of the unit. In this case, a size of the connecting pad can be made larger than that of a through hole 32, so that the units can be easily connected and the reliability of the connected portions is increased. Further, alloy 33 of a low melting point other than wiring metal is used for the connection, and the units are securely connected electrically and mechanically in such a manner that the alloy is heated to a temperature higher than the melting point thereof under pressure. The respective units may be sequentially connected from the ceramic substrate side thereof, or the thin film wiring portion may be connected to the ceramic substrate after the respective units of the thin film wiring portion have been connected.

The structure of the thin film wiring portion composed of several divided units connected to each other, which is arranged as described above, enables the respective units to be individually made and inspected at the same time, whereby the yield thereof as a mounting substrate is improved and the mounting substrate can be made in a short time.

Next, a method of manufacturing the above wiring unit will be described.

Each wiring unit is made using a thin film process. Since the thin film process can miniaturize a wiring more easily than a thick film process, it can miniaturize a minimum width of the wiring to about 10 to 20 micrometers. Since a wiring resistance is increased as a width of the wiring is reduced, however, a thickness thereof must be increased to prevent an increase in the resistance. For example, when the wiring has a width of 20 micrometers, a thickness thereof is preferably 20 micrometers or more, and thus an aspect ratio of a cross section of the wiring is 1 or more. Therefore, when a unit substrate is to be made from this thick film, a plating method is used to form a conductor and a method of coating polyimide varnish to a thick film and thermosetting the same is used to form an insulating film.

FIGS. 2(a) to 2(e) show the various processing steps of a method of manufacturing a wiring unit composed of four layers using copper and polyimide. First, a tentative substrate 21 having sufficient rigidity and flatness not to be deformed by the formation of a polyimide film and a surface 22 the bonding force of which to a wiring unit is adjusted to a suitable range is prepared, and a copper film 23 serving as a power supply layer or ground layer is formed thereon by a plating method. Next, after a pattern has been formed using photoresist 24, the copper film 23 is etched. Further, after polyimide varnish has been coated and thermally set, a portion of a polyimide layer 25 is opened by being etched to form a through hole 26. Further, the through hole is filled with copper by a plating method to complete the formation of the wiring of a first layer 27. The conductive wirings of a second layer 28, third layer 29, and fourth layer 30 are formed by repeating the same process. Finally, an alloy film 32 of Au-Sn, Au-Si, Pb-Sn or the like formed on the surface 31 of connecting pads provided in the conductive layer of the fourth layer.

The reason why the substrate needs the sufficient flatness and rigidity in this process is to uniformly arrange a height of the connecting pads formed in the power supply layer of the fourth layer and to securely connect the units thereafter. Further, the when using the tentative substrate in connection with the formation of the wiring units, one bonding force of which to the under surface of the units i.e., to the copper film of the first layer 27 is adjusted to a suitable range so as to prevent the tentative substrate from being exfoliated from the unit during the formation of the wiring units and to enable the tentative substrate to be separated from the units without damaging the connected portions after the respective units have been connected. For this purpose, a material of the tentative substrate and surface roughness thereof must be selected. In the case of a copper film, stainless is most suitable and a bonding force can be controlled by changing the surface roughness. The bonding force is such that it does not cause exfoliation and separation in the process in which the above wiring units are made and must be adjusted to a range smaller than a bonding force between the units.

Figure 3A:
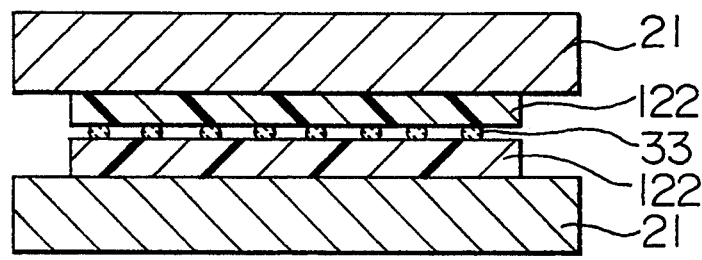
FIG. 3(a) and 3(b) show a method of connecting wincing units.
Figure 3B:
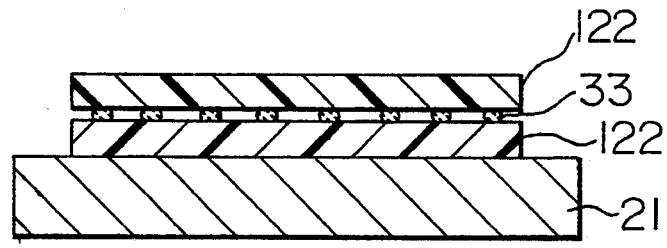

FIG. 3(a) and 3(b) show a method of connecting the units. The tentative substrate 21 used for making the units is also used as a carrier and connecting jig as it is to connect the units. More specifically, the units 122 are connected in such a manner that the units formed on the tentative substrate are arranged so that they are confronted to each other, pressure is applied thereto after the connecting pads have been aligned, and then solder 33 on the pad surfaces is heated to the melting temperature thereof. Thereafter, only the tentative substrate is separated from the wiring unit to complete the connection of a single unit. All the units can be connected by repeating this process. In this case, if there is a fear that the connecting pads may be broken when the tentative substrate is separated, a bonding force between the connected units may be reinforced by filling other portions therebetween with solder, thermosetting resin, or the like.

Further, when the units must be aligned with pinpoint accuracy, the pattern position on the tentative substrate is read by an image sensor before the units are confronted to each other, and then the units are subject to an automatic alignment based on the data obtained by reading the pattern.

As described above, according to the present invention, there are advantages in that a thin film multi-layered wiring having many laminated layers can be made as units divided with respect to each other and each unit can be independently inspected. As a result, therefore yield as a whole is greatly improved and throughput can be reduced.

Further, there is also an advantage in that a wiring unit formed by using a tentative substrate enables a signal layer having a fine wiring width to be easily formed, and an accuracy, with which the respective units to be connected to each other are aligned, is improved. Therefore, computers having high reliability can be produced by use of the mounting substrate of the present invention.

What is claimed is:

1. A mounting substrate for LSIs having a multi-layered thin film wiring portion formed on a silicon or ceramic substrate, wherein said thin film wiring portion includes a vertically stacked arrangement of plural, preformed wiring units, each wiring unit having first and second, opposing main surfaces and including wirings composed of a plurality of wiring layers provided as a multilevel arrangement of conductive layers, each wiring layer within a wiring unit being isolated by an insulator from an adjacent, higher level wiring layer except for portions thereof extending vertically via through holes of said insulator and provided for interconnecting said wiring layer and said adjacent, higher level wiring layer thereof, said wirings between respective wiring units being electrically connected through connecting pads formed at the main surfaces thereof, the pads at a main surface of said wiring unit being provided from a same level layer of said multilevel arrangement as that of a corresponding surface conductive layer of said wiring unit, each said wiring unit except for an uppermost wiring unit of said vertically stacked arrangement including two, internally provided signal line layers, a power supply layer and a ground layer, said power supply layer and said ground layer are formed at said opposing, main surfaces thereof, respectively, and which surfaces correspond to substantially flat, upper and lower surfaces of the insulator associated with said wiring unit, and interconnections of the respective layers of said wiring unit are provided via through holes in said insulator.

2. A mounting substrate according to claim 1, wherein said uppermost wiring unit is composed of a pair of conductive layers for providing pads on each of the first and second, opposing main surfaces thereof, said pair of conductive layers have interposed therebetween a third conductive layer composed of a plurality of conductive film portions each of an enlarged size and arranged for adjusting a pitch of the pads and a pitch of through holes in an associated insulator for interconnecting the pads on the opposing, main surfaces thereof via the interposed third conductive layer, and the pads on the first of said opposing, main surfaces of said uppermost wiring unit being disposed for connection to said LSI and the pads on the second of said opposing, main surfaces thereof being connected to the pads of the first of said opposing, main surfaces of an adjacent, lower positioned wiring unit.

3. A mounting substrate according to claim 2, wherein said power supply layer and said ground layer are associated with the same level conductive layer at the opposing, main surfaces of a wiring unit as are the connecting pads associated therewith.

4. A mounting substrate according to claim 1, wherein the plurality of wiring layers of said wiring unit are comprised of any one metal of Cu, Al, Au, and Ag.

5. A mounting substrate according to claim 1, wherein the insulator of each said wiring unit is comprised of a polyimide.

6. A mounting substrate according to claim 1, wherein the conductive films at surfaces of two wiring units adjacently disposed in confrontation for connection have the same conductive pattern configuration.

7. A mounting substrate according to claim 1, wherein said connecting pads corresponding to each of said wiring units are of a size larger than that of through holes for facilitating connection of the pads to the wirings of respective inner layers associated therewith.

8. A mounting substrate according to claim 1, wherein each said wiring unit is formed by a thin film process and said vertically stacked arrangement is provided on another wiring portion having a lower wiring density and comprised of a relatively thick wiring substrate having a first main surface on which said thin film wiring portion is stacked thereover, said wiring substrate corresponding to said silicon or ceramic substrate.

9. A mounting substrate according to claim 2, wherein the plurality of wiring layers of each said wiring unit are comprised of any one metal of Cu, Al, Au, and Ag.

10. A mounting substrate according to claim 3, wherein the plurality of wiring layers of each said wiring unit are comprised of any one metal of Cu, Al, Au, and Ag.

11. A mounting substrate according to claim 2, wherein said insulator is comprised of plural layers of a polyimide film, which together form the shape of the respective wiring units, and which are included in each said wiring unit to respectively electrically isolate all unconnected portions of the wiring layers associated therewith.

12. A mounting substrate according to claim 11, wherein the plurality of wiring layers of each said wiring unit are comprised of any one metal of Cu, Al, Au, and Ag.

13. A mounting substrate according to claim 10, wherein the conductive films at main surfaces of two wiring units adjacently disposed in confrontation for connection have the same conductive pattern configuration.

14. A mounting substrate according to claim 13, wherein said connecting pads corresponding to each of said wiring units are of a size larger than that of through holes for facilitating connection of the pads to the wirings of respective inner layers associated therewith.

15. A mounting substrate according to claim 10, wherein said connecting pads corresponding to each of said wiring units are of a size larger than that of through holes for facilitating connection of the pads to the wirings of respective inner layers associated therewith.

16. A mounting substrate according to claim 2, wherein a power supply layer and a ground layer associated with each said wiring unit are provided as the only conductive layers at the opposing surfaces thereof, respectively.

17. A mounting substrate according to claim 16, wherein said insulator is comprised of plural layers of a polyimide film, which together form the shape of the respective wiring units, and which are included in each said wiring unit to respectively electrically isolate all unconnected portions of the wiring layers associated therewith.

18. A mounting substrate according to claim 17, wherein said connecting pads corresponding to each of said wiring units are of a size larger than that of through holes for facilitating connection of the pads to the wirings of respective inner layers associated therewith.

19. A mounting substrate according to claim 18, wherein pads at the first and second opposing, main surfaces of a wiring unit are fixedly joined to corresponding pads, respectively, of the second main surface of an adjacent, higher positioned wiring unit and the first main surface of an adjacent, lower positioned wiring unit, in said vertically stacked arrangement, via a metal alloy other than that of a wiring metal.

20. A mounting substrate according to claim 19, wherein each said wiring unit is formed by a thin film process and said vertically stacked arrangement is provided on another wiring portion comprised of a relatively thick wiring substrate having a first main surface on which said thin film wiring portion is stacked thereover, said wiring substrate having a substantially lower wiring density than said thin film wiring portion and being formed of different material than that of said thin film wiring portion.

21. A mounting substrate according to claim 20, wherein the plurality of wiring layers of each said wiring unit are comprised of any one metal of Cu, Al, Au, and Ag.

22. A mounting substrate according to claim 1, wherein said silicon or ceramic substrate constitutes another wiring portion comprised of a relatively thick wiring substrate having a first main surface on which said thin film wiring portion is stacked thereover, said wiring substrate having a substantially lower wiring density than said thin film wiring portion and being formed of different material than that of said thin film wiring portion.

23. A mounting substrate according to claim 19, wherein said silicon or ceramic substrate constitutes another wiring portion comprised of a relatively thick wiring substrate having a first main surface on which said thin film wiring portion is stacked thereover, said wiring substrate having a substantially lower wiring density than said thin film wiring portion and being formed of different material than that of said thin film wiring portion.

* * * * *